United States Patent [19]

Tanigaki et al.

[11] Patent Number: 4,690,882

[45] Date of Patent: Sep. 1, 1987

[54] POSITIVE ACTING RESIST MATERIAL COMPRISED OF NOVOLOC RESIN DERIVED FROM PHENYLPHENOL

[75] Inventors: Katsumi Tanigaki; Yasuo Iida, both of Tokyo, Japan

[73] Assignee: NEC Corporation, Tokyo, Japan

[21] Appl. No.: 780,038

[22] Filed: Sep. 25, 1985

[30] Foreign Application Priority Data

Sep. 28, 1984 [JP] Japan ................. 59-203234

[51] Int. Cl.⁴ .................. G03C 1/52; G03C 1/495
[52] U.S. Cl. .................... 430/192; 430/270; 430/326
[58] Field of Search .............. 430/270, 192, 326

[56] References Cited

U.S. PATENT DOCUMENTS

| | | | |
|---|---|---|---|
| 3,526,503 | 10/1970 | Dunham et al. | 430/192 X |
| 4,123,279 | 10/1978 | Kobayashi | 430/192 X |
| 4,173,470 | 11/1979 | Fahrenholtz et al. | 430/270 X |
| 4,289,845 | 9/1981 | Bowden et al. | 430/296 |
| 4,308,368 | 12/1981 | Kubo et al. | 430/326 X |

*Primary Examiner*—John E. Kittle
*Assistant Examiner*—Cynthia Hamilton
*Attorney, Agent, or Firm*—Burns, Doane, Swecker & Mathis

[57] ABSTRACT

A mixture of an alkali soluble resin and either a quinonediazide compound or poly(2-methylpentene-1-sulfone provides a positive acting resist material, which is very high in a critical exposure dose at which the resist begins to gel by radiation-induced crosslinking. By using this resist material in direct delineation of patterns with ionizing radiation, the problem of gelling of the resist film in the areas repeatedly scanned for the detection of the alignment marks is obviated. A novolac resin comprising a t-butylphenol or phenylphenol segment is suitable as the alkali soluble resin.

8 Claims, 3 Drawing Figures

POSITIVE ACTING RESIST MATERIAL COMPRISED OF NOVOLOC RESIN DERIVED FROM PHENYLPHENOL

BACKGROUND OF THE INVENTION

This invention relates to a positive acting resist material for use in the lithographic process of forming patterns in the manufacture of microelectronic devices such as, for example, semiconductor devices and bubble memory elements. The resist material is of the type comprised of an alkali soluble resin and a photosensitive agent.

In the manufacture of microelectronic devices represented by semiconductor devices by direct delineation of patterns with an ionizing radiation, desired patterns are first formed in a resist material coated on a substrate. The substrate is formed with alignment marks in advance. To form patterns in the predetermined locations of the resist layer on the substrate, the alignment marks are detected by scanning with a charged beam before the exposure and development operations. The resist layer formed with the patterns serves as a protecting layer in the subsequent operation for processing the underneath substrate or implanting ions into the substrate. Accordingly the formation of the resist patterns is a very important operation step in the entire manufacturing process.

At the step of forming such resist patterns, either a positive acting resist or a negative acting resist is selectively used depending on some factors such as the proportion of the areas to be exposed and the manner of processing the substrate. For example, in the cases of forming contact holes it is very favorable and is prevailing to employ a positive acting resist for forming resist patterns.

Conventional positive acting resists for use in forming patterns by direct delineation with electron beam are generally composed of a cresol-formaldehyde novolac resin and a photosensitive agent, which is usually either a quinonediazide compound or poly(2-methylpentene-1-sulfone). As is well known, these positive acting resists become insoluble by crosslinking reaction when exposed at high doses. This property of the positive acting resists raises a problem in connection with the aforementioned detection of the alignment marks, which is an indispensable operation step in the lithography process for forming patterns.

That is, the positive acting resist film undergoes crosslinking reaction and consequently turns into an insoluble gel in the areas around the alignment marks on the substrate since the scanning with a beam of charged particles for detecting the alignment marks is repeated many times, viz. nearly 50 times in most cases, on each substrate coated with the resist film. In the case of electron beam exposure it is desirable to keep the column conditions unchanged even at the times of detecting the alignment marks with a view to enhancing the precision of the lithography process. Accordingly, at each time of detecting the alignment marks the resist film is locally scanned with electron beam at the same exposure dose as in the exposure operation to form positive tone patterns. Therefore, gelling of the resist film in the repeatedly scanned areas is promoted and intensified. Since the gelled areas of the resist film can hardly be removed by ordinary solvents, it is usual to perform ashing with oxygen or dipping in a heated remover liquid comprising a strong acid such as nitric acid or sulfuric acid for removal of the gelled resist. However, unfavorable effects of such treatment on the substrate cannot be neglected.

SUMMARY OF THE INVENTION

It is an object of the present invention to provide a positive acting resist material, which is of use in direct delineation of patterns with an ionizing radiation and which is sufficiently low in the tendency toward radiation-induced crosslinking so that the above described problem in connection with the detection of the alignment marks is obviated.

A positive acting resist material according to the invention comprises a mixture of an alkali soluble resin and a photosensitive agent which is either a quinonediazide compound or poly(2-methylpentene-1-sulfone). The alkali soluble resin is selected such that the ratio of a critical exposure dose ($D_N$) at which the resist material begins to gel by crosslinking or, in other words, at which a transition from the positive resist action to negative resin action occurs, to an exposure dose ($D_P$) sufficient to form a positive tone pattern in the resist material is not smaller than 50.

Concerning the lithographic process of forming positive tone patterns in a resist film coated on a substrate by exposure to an ionizing radiation and subsequent development with an alkali solution, we have confirmed that, by using a positive acting resist material in which the above defined dose ratio $D_N/D_P$ is not smaller than 50, the detection of the alignment marks by scanning with the ionizing radiation does not result in gelling of the resist film in the repeatedly scanned areas. Furthermore, we have found that, in a resist material obtained by adding a photosensitive agent to an alkali soluble resin such as a novolac resin, reaction between the photosensitive radical such as quinonediazo group and the matrix resin is negligible and that there is no correlation between $D_P$ and $D_N$ of such a resist material. Based on these facts the present invention has been reached by discovering that selection of a suitable combination of a matrix resin and a photosensitive agent provides a positive acting resist material in which the ratio of $D_N$ to $D_P$ is not smaller than 50.

A resist material according to the invention is fully practicable in the conventional methods of lithographically forming positive tone resist patterns and is sufficiently high in the sensitivity to ionizing radiation such as electron beam. When this resist material is used, the removal of the resist film can easily be accomplished even in the areas repeatedly exposed for detecting the alignment marks without the need of making an unfavorable and troublesome treatment such as ashing with oxygen.

DETAILED DESCRIPTION OF THE INVENTION

For example, the following experiment has evidenced that quinonediazo group of a photosensitive agent in a resist material does not react with a novolac resin used as the matrix resin. In the experiment a novolac resin prepared from meta-cresol and formaldehyde and three kinds of photosensitive agents (A), (B) and (C) having at least one quinonediazo group were used.

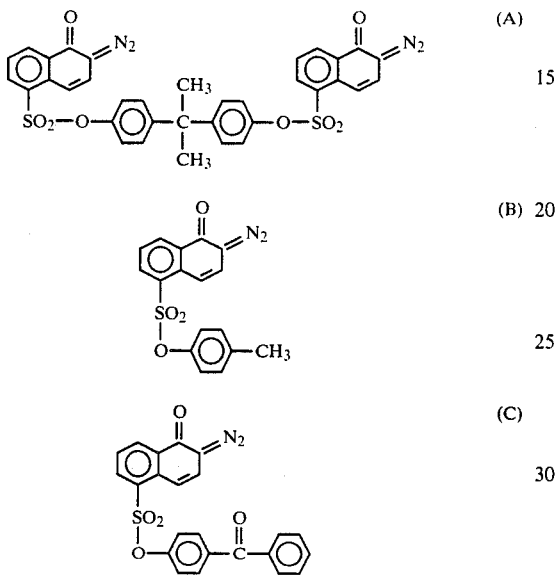

A mixture of the novolac resin and 30 wt % of the photosensitive agent (A), (B) or (C) was dissolved in dioxane so as to obtain 20 wt % solution. The solution was spin-coated on a silicon wafer and prebaking was performed at 80° C. for 30 min to thereby form a resist film having a thickness of about 8000 Å (Angstrom). The resist film was irradiated with electron beam (acceleration voltage was 20 kV) at varying doses, followed by developing with 0.2 N NaOH solution for 40 sec and rinsing for 30 sec, to determine an exposure dose $D_P$ sufficient for positive resist action. The resist films irradiated at various doses were immersed in tetrahydrofuran for 90 sec to find a critical exposure dose $D_N$ at which the resist became partially insoluble.

Figure 1:
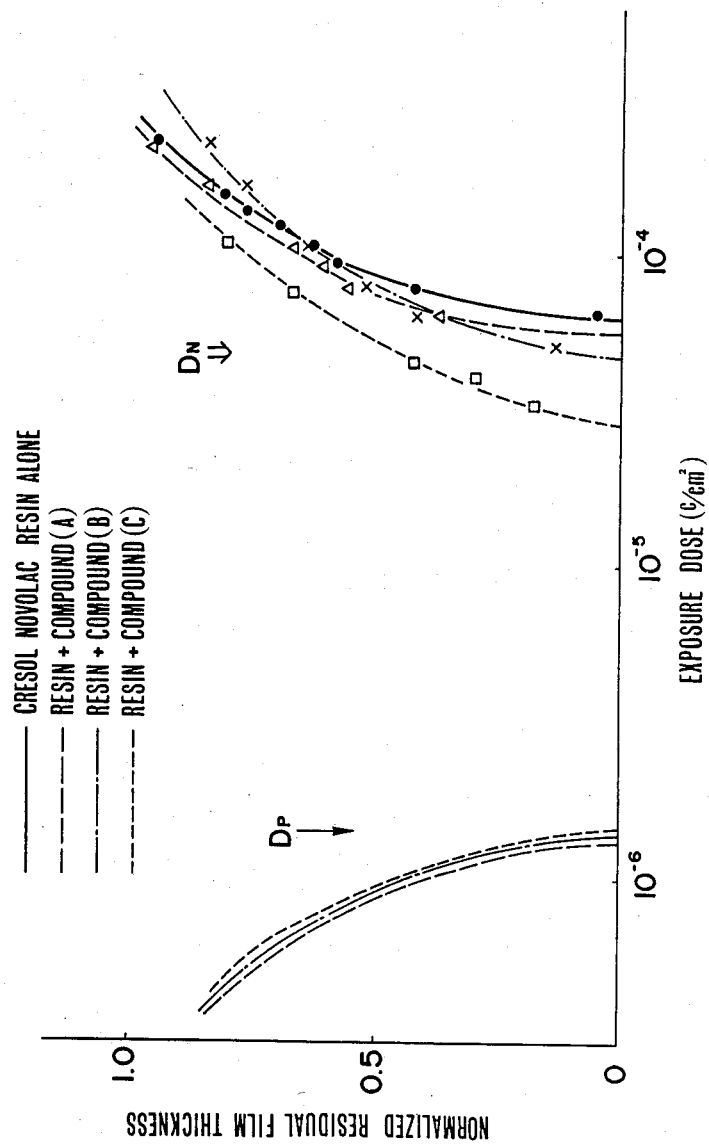
FIG. 1 is a graph showing the effects of three different kinds of quinonediazide compounds respectively added to a cresol novolac resin on the sensitivity and radiation-induced crosslinking tendency of the resultant mixtures.

As shown in FIG. 1, $D_N$ of the resist material containing either the quinonediazide compound (A) having two functional groups or the compound (B) having one functional group was almost equivalent to the $D_N$ of the novolac resin itself. The resist material containing the compound (C) exhibited a slightly smaller value of $D_N$, but this was attributed to some reaction between the novolac resin and the compound (C) at its carbonyl group remote from the quinonediazo group. As to $D_P$, no difference was produced by alternatively using the three compounds (A), (B) and (C). This is indicative of similarlity of the quinonediazo groups of these three compounds in reactivity.

As will be understood from the results of this experiment there is no correlation between the reactivity of quinonediazo group of a photosensitive agent used to control $D_P$ and $D_N$ of the obtained positive acting resist material. Accordingly it is possible to obtain a positive resist material in which the ratio $D_N/D_P$ is not smaller than 50 by selecting a suitable matrix resin.

In general it is effective for increasing the value of $D_N$ to decrease the molecular weight of the matrix resin. However, low molecular weight resins are inferior in the film forming capability so that the performance of positive acting resists using such resins becomes relatively low. It is desirable to suppress gelling of a positive acting resist resulting from radiation-induced crosslinking reaction without decreasing the molecular weight of the matrix resin.

We have discovered that a group of novolac resins represented by the general formula (1) and another group of novolac resins represented by the general formula (2) are readily soluble in aqueous alkali solutions useful as developer liquids and are very lower in the tendency toward radiation-induced crosslinking reaction than ordinary novolac resins used in conventional resist materials.

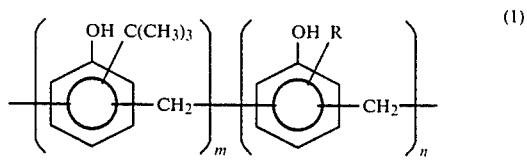

wherein R represents H or $CH_3$, and m and n are positive integers, respectively.

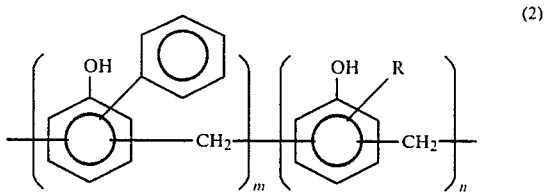

wherein R represents H or $CH_3$, and m and n are positive integers, respectively.

A positive acting resist material is obtained by adding either a quinonediazide compound or poly(2-methylpentene-1-sulfone) as photosensitive agent to a novolac resin represented by either the general formula (1) or the general formula (2). The mixture is very low in the tendency toward radiation-induced crosslinking reaction and can meet the requirement that $D_N/D_P$ be not smaller than 50. In the pattern forming process using this resist material, complete removal of the resist film can easily be accomplished since repeated irradiation with charged particles for the detection of the alignment marks does not cause gelling of the resist. Since the matrix resin is readily soluble in an aqueous alkali solution the positive resist action of this resist material is not impaired though the value of $D_N$ is very great.

According to S.R. Fahrenholtz, J. Vac. Sci. Technol., 19(4), 1111(1981), crosslinking reaction of a novolac resin is suppressed by the presence of a spatially bulky substituent such as propyl group, butyl group or phenyl group on the phenyl ring. However, our studies have revealed that novolac resins modified by merely introducing spatially bulky substituent groups are hardly soluble in aqueous alkali solutions useful as developer liquids and, therefore, do not serve for practical purposes. Furthermore, we have discovered that crosslinking of a novolac resin in a positive acting resist is not attributed to reaction of the novolac resin with quinonediazo group of the photosensitive agent while Fahrenholts mentions nothing about this fact.

In a novolac resin represented by either the general formula (1) or the general formula (2) as the matrix resin of a resist material according to the invention, it is desirable that the molar ratio of the tert-butylphenol component or the phenylphenol component to the other phenol or cresol component be in the range from 0.2:0.8 to 0.8:0.2. When the amount of the tert-butylphenol or phenylphenol component is less than 0.2 the effect of suppressing crosslinking reaction is insufficient, and when the amount of this component is more than 0.8 the novolac resin is very low in solubilities in aqueous alkali solutions.

It is preferable that the t-butyl or phenyl substitution in the novolac resin is at the ortho-position of the phenol because the substitution at this position is higher in the effect of suppressing crosslinking reaction than the substitution at the meta-or para-position.

As to the amount of the photosensitive agent, a suitable range is 20–40 wt % of the matrix resin in the case of a quinonediazide compound and 10-30 wt % in the case of poly(2-methylpentene-1-sulfone). If the amount of the photosensitive agent is too small the dissolution inhibiting effect is insufficient so that the positive action of the resist material is poor. On the other hand, the use of an excessively large amount of photosensitive agent results in lowering of sensitivity as a positive acting resist.

The invention will further be illustrated by the following nonlimitative example.

EXAMPLE 1

First, 5 g of ortho-(tert-butyl)phenol, 4 g of ortho-cresol and 5.8 g of 35% aqueous solution of formaldehyde were charged in a flask. After adding 0.8 g of 35% hydrochloric acid solution as catalyst, the mixture was subjected to polymerization reaction at 120° C. for 1 hr. By reprecipitation from water, 5 g of a white powder was obtained from the reaction liquid. This powder was confirmed to be a novolac resin composed of ortho-(tert-butyl)phenol, ortho-cresol and bridging methylene groups, as represented by the general formula (1), by nuclear magnetic resonance (NMR) analysis. NMR Spectrum Characteristics (in $CDCl_3$)

| $\delta$ (ppm): | 1.33 | ($-C(CH_3)_3$) |
| --- | --- | --- |
| | 2.13 | ($-CH_3$) |
| | 3.80 | ($-CH_2-$) |
| | 6.67–7.0 | 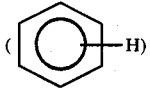 |

Ratio between Phenolic Components

The molar ratio of o-(tert-butyl)phenol to o-cresol in the novolac resin was 0.53:0.47.

This novolac resin was dissolved in ethyl cellosolve acetate to prepare 20 wt % solution. The solution was spin-coated on a silicon wafer, and prebaking was performed at 90° C. for 30 min to thereby form a resin coating film having a thickness of 8000 A. The resin film was irradiated with electron beam at varing exposure doses to determine a critical dose at which the resin becomes insoluble. The critical dose was $3 \times 10^{-3}$ $C/cm^2$.

Figure 2:
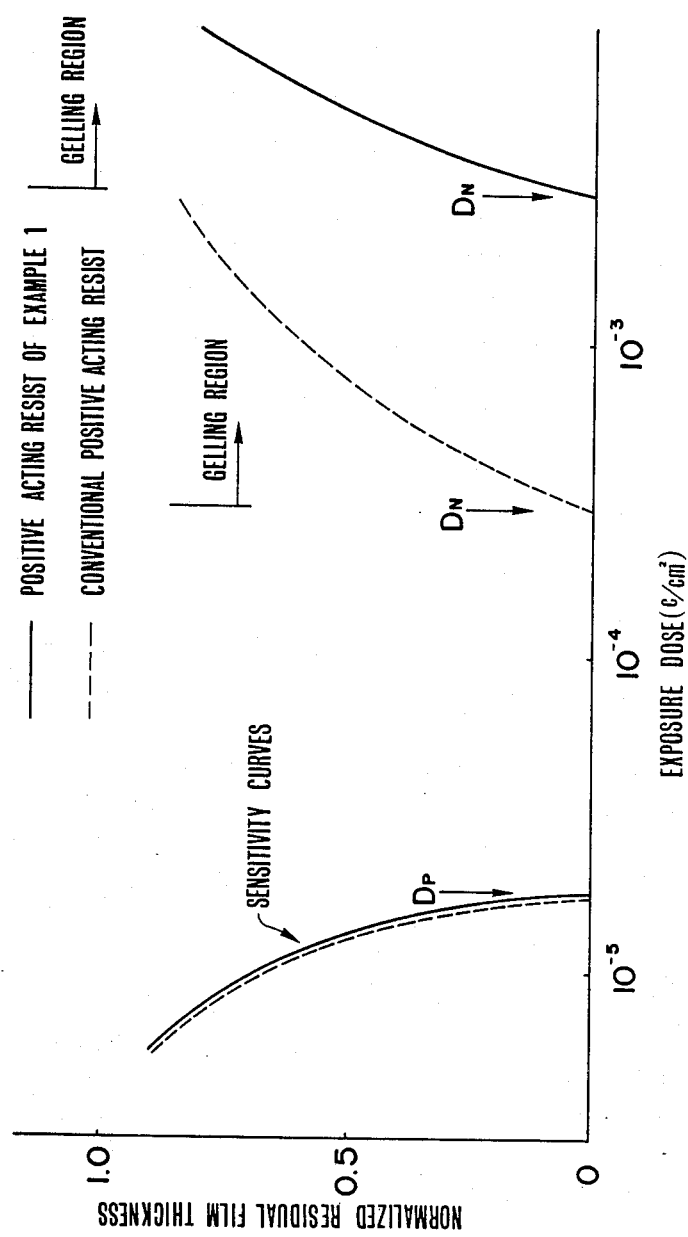
FIG. 2 is a graph showing the sensitivity and radiation-induced crosslinking tendency of a resist material as an example of the invention in comparison with a conventional positive acting resist material.

A resist solution was prepared by dissolving a mixture of the novolac resin and 30 wt % of naphthoquinone (1,2)diazide(2)-5-sulfonic acid p-methylphenol ester used as a photosensitive agent in ethyl cellosolve acetate. The resist solution was spin-coated on a silicon wafer, followed by prebaking at 80° C. for 30 min, so as to form a resist film having a thickness of 6000 A. Positive tone patterns were formed in the resist film by irradiating with electron beam and developing with 0.3 N aqueous solution of sodium hydroxide to result in that 0.5 $\mu$m lines and spacings were resolved at an exposure dose ($D_P$) of $20 \times 10^{-6} C/cm^2$. The critical dose ($D_N$) at which the resist film began to gel was measured to be $3 \times 10^{-3} C/cm^2$. That is, the addition of the photosensitive agent produced little change in this respect. Therefore, the ratio $D_N/D_P$ was 150. In FIG. 2, the curves in solid line represent the positive action sensitivity and gelling tendency of this resist. For comparison, the curves in broken line represent the same matters with respect to a conventional positive resist composed of a cresol-formaldehyde novolac resin and a photosensitive agent. In the case of this conventional resist the ratio $D_N/D_P$ was only about 20.

COMPARATIVE EXAMPLE 1

A novolac resin was prepared by reacting ortho-(tert-butyl)phenol with formaldehyde by substantially the same method as in Example 1 (but without using o-cresol) and another novolac resin by reacting para-(tert-butyl)phenol with formaldehyde by substantially the same method. When irradiated with electron beam, the novolac resin with tert-butyl substitution at the ortho-position began to gel at an exposure dose of $5 \times 10^{-3}$ $C/cm^2$ and the other novolac resin with tert-butyl substitution at the para-position at a dose of $3 \times 10^{-3}$ $C/cm^2$. However, both of these two kinds of novolac resins were scarcely soluble in 1 N aqueous solution of sodium hydroxide.

COMPARATIVE EXAMPLE 2

Figure 3:
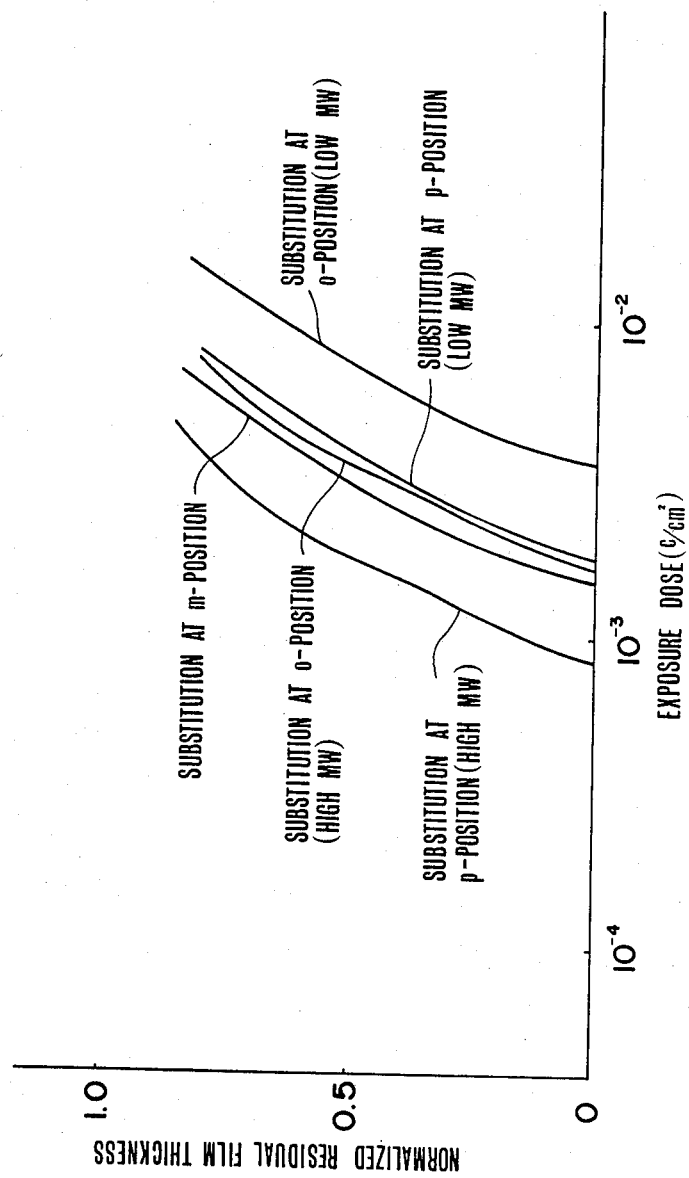
FIG. 3 is a graph showing radiation-induced crosslinking tendencies of novolac resins prepared from cresols substituted at different positions.

With respective to cresol-formaldehyde novolac resins having tert-butyl substitution at the ortho-position, at the meta-position and at the para-position, respectively, the critical exposure dose at which each resin began to gel was examined. The results are shown in FIG. 3. As can be seen, the substitution at the ortho-position exhibited the highest effect on the suppression of crosslinking reaction. When the tert-butyl substituted novolac resins were relatively low in molecular weight the resins began to undergo crosslinking reaction at greater doses. However, such low molecular resins were inferior in the film forming capability and therefore could not be used as the matrix resin of a positive resist.

EXAMPLE 2

A resist solution was prepared by dissolving a mixture of the novolac resin prepared in Example 1 and 10 wt % of poly(2-methypentene-1-sulfone) used as a photosensitive agent in isoamyl acetate in a concentration of 5 wt %. Using this resist solution a resist film was formed on a silicon wafer in the same manner as in Example 1, and the exposure tests described in Example 1 were conducted in the same manner. At a dose ($D_P$) of $10 \times 10^{-6} C/cm^2$, 0.5 $\mu$m lines and spacings were resolved. The critical dose ($D_N$) at which the resist film began to gel was measured to be $3 \times 10^{-3}$ C/cm² also in this case. Therefore, the ratio $D_N/D_P$ was 300, which was far greater than the permissible minimum value 50.

EXAMPLE 3

Using ortho-(tert-butyl)phenol, phenol and formaldehyde as raw materials and hydrochloric acid as catalyst, a novolac resin was prepared by substantially the same method as in Example 1. By NMR analysis the structure of the novolac resin was confirmed to be as represented by the general formula (1), wherein R was H in this case.

NMR Spectrum Characteristics (in CDCl₃)

| δ (ppm): | 1.30 | (—C(CH₃)₃) |
|---|---|---|
| | 3.90 | (—CH₂—) |
| | 6.67–7.20 | 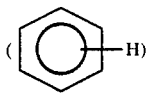 |

Ratio between Phenolic Components

The molar ratio of o-(tert-butyl)phenol to phenol in the novolac resin was 0.33:0.67.

Using a mixture of this novolac resin and 10 wt % of poly(2-methylpentene-1-sulfone) as a resist material, the exposure tests described in Example 1 were conducted in the same manner. At a dose of $30 \times 10^{-6}$ C/cm², 0.3 μm lines and spacings were resolved. The critical does at which the resist film began to gel was $1.5 \times 10^{-3}$ C/cm², which was equivalent to the critical dose for the novolac resin before the addition of the photosensitive agent.

EXAMPLE 4

A resist solution was prepared by dissolving a mixture of the novolac resin prepared in Example 3 and 30 wt% of naphthoquinone-(1,2)diazide(2)-5-sulfonic acid p-hydroxybenzophenone ester in ethyl cellosolve acetate. Using this resist solution the tests described in Example 1 were conducted in the same manner. At a dose of $20=10^{-6}$ C/cm², 0.5 μm lines and spacings were resolved. The critical exposure dose at which the resist film began to gel was $1 \times 10^{-3}$ C/cm².

EXAMPLE 5

First, 5 g of ortho-phenylphenol, 3.1 g of ortho-cresol and 4.5 g of 35% aqueous solution of formaldehyde were charged in a flask. After adding 0.8 g of 35% hydrochloric acid solution as catalyst, the mixture was subjected to polymerization reaction at 120° C. for 1 hr. By reprecipitation from water, 5 g of a white powder was obtained from the reaction liquid. By NMR analysis this powder was confirmed to be a novolac resin the structure of which was as represented by the general formula (2), wherein R was CH₃ in this case. NMR Spectrum Characteristics (in CDCl₃)

| δ (ppm): | 2.13 | (—CH₃) |
|---|---|---|
| | 3.80 | (—CH₂—) |
| | 6.67–7.5 | 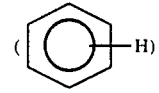 |

Ratio between Phenolic Components

The molar ratio of o-phenylphenol to o-cresol in the novolac resin was 0.53:0.47.

This novolac resin was dissolved in ethyl cellosolve acetate to prepare 20 wt% solution. The solution was spin-coated on a silicon wafer, and prebaking was performed at 90° C. for 30 min to thereby form a resin coating film having a thickness of 8000 Å. The resin film was irradiated with electron beam at varying exposure doses to determine a critical dose at which the resin becomes insoluble. The critical dose was $5 \times 10^{-3}$ C/cm².

A resin solution was prepared by dissolving a mixture of the novolac resin and 30 wt% of naphthoquinone(1,2)diazide(2)-5-sulfonic acid p-methylphenol ester in ethyl cellosolve acetate. The resist solution was spin-coated on a silicon wafer, followed by prebaking at 80° C. for 30 min, so as to form a resist film having a thickness of 6000 Å. Positive tone patterns were formed in the resist film by irradiation with electron beam and developing with 0.3 N aqueous solution of NaOH to result in that 0.5 μm lines and spacings were resolved at an exposure dose ($D_P$) of $20 \times 10^{-6}$ C/cm². The critical dose ($D_N$) at which the resist film began to gel was measured to be $5 \times 10^{-3}$ C/cm², which was equivalent to the critical dose for the novolac resin itself.

COMPARATIVE EXAMPLE 3

A novolac resin was prepared by reacting meth-phenylphenol with formaldehyde by substantially the same method as in Example 5 and another novolac resin by reacting para-phenylphenol with formaldehyde by substantially the same method. When irradiated with electron beam, the novolac resin with phenyl substitution at the para-position began to gel at an exposure dose of $7 \times 10^{-3}$ C/cm² and the novolac resin with phenyl substitution at the para-position at dose of $6 \times 10^{-3}$ C/cm². However, both of these two kinds of novolac resins were scarcely soluble in 1 N aqueous solution of NaOH.

EXAMPLE 6

A resist solution was prepared by dissolving a mixture of the novolac resin prepared in Example 5 and 19 wt% of poly(2-methylpentene-1-sulfone) in isoamyl acetate in a concentration of 5 wt%. Using this resist solution a resist film was formed on a silicon wafer in the same manner as in Example 5, and the tests described in Example 5 were conducted in the same manner. At a dose ($D_P$) of $10 \times 10^{-6}$ C/cm², 0.5 μm lines and spacings were resolved. The critical dose ($D_N$) at which the resist film began to gel was $5 \times 10^{-3}$ C/cm² also in this case.

EXAMPLE 7

Using ortho-phenylphenol, phenol and formaldehyde as raw materials and hydrochloric acid as catalyst, a novolac resin was prepared by substantially the same method as in Example 5. By NMR analysis the structure of the novolac resin was confirmed to be as represented by the general formula (2), wherein R was H in this case. NMR Spectrum Characteristics (in CDCL$_{13}$)

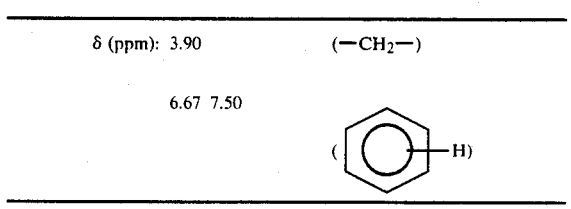

Ratio between Phenolic Components

The molar ratio of o-phenylphenol to phenol in the novolac resin was 0.33:0.67.

EXAMPLE 8

A resist solution was prepared by dissolving a mixture of the novolac resin prepared in Example 7 and 30 wt% of naphthoquinone-(1,2)diazide(2)-5-sulfonic acid p-hydroxybenzophenone ester in ethyl cellosolve acetate. Using this resist solution the tests described in Example 5 were conducted in the same manner. In this case 0.5 μm lines and spacings were resolved at a dose of $20 \times 10^{-6}$ C/cm$^2$. The critical exposure dose at which the resist film began to gel was $5 \times 10^{-3}$ C/cm$^2$, which was equivalent to the critical dose for the novolac resin before the addition of the photosensitive agent.

What is claimed is:

1. A positive acting resist material comprising a mixture of a novolac resin represented by the following general formula:

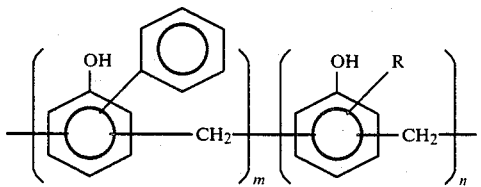

wherein R represents H or CH$_3$ and m and n are positive integers, respectively, and, a photosensitive agent which is a quinonediazide compound.

2. A resist material according to claim 1, wherein the amount of said photosensitive agent is 20-40 wt% of said resin.

3. A positive acting resist material comprising a mixture of a novolac resin represented by the following general formula:

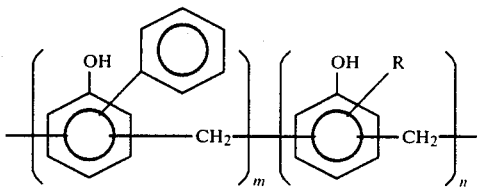

wherein R represents H or CH$_3$, and m and n are positive integers, respectively, and, a photosensitive agent which is poly(2-methylpentene-1-sulfone).

4. A resist material according to claim 3, wherein the amount of said photosensitive agent is 10-30 wt% of said resin.

5. A positive acting resist material comprising a mixture of a novolac resin and a photosensitive agent, said novolac resin being represented by the general formula:

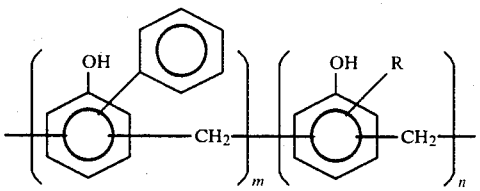

wherein R represents H or CH$_3$, and m and n are positive integers, respectively, and being selected such that the ratio of a critical exposure dose (D$_N$) at which the resist material begins to gel crosslinking to an exposure dose (D$_P$) sufficient to form a positive tone pattern in the resist material is not smaller than 50, and a photosensitive agent which is a quinonediazide compound.

6. A resist material according to claim 5, wherein the amount of said photosensitive agent is 20-40 wt% of said resin.

7. A positive acting resist material comprising a mixture of a novolac resin and a photosensitive agent, said novolac resin being represented by the general formula:

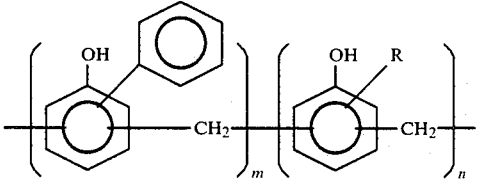

wherein R represents H or CH$_3$, and m and n are positive integers, respectively, and being selected such that the ratio of a critical exposure dose (DN) at which the resist material begins to gel by crosslinking to an exposure dose (DP) sufficient to form a positive tone pattern in the resist material is not smaller than 50, and a photosensitive agent which is poly(2-methylpentene-1-sulfone).

8. A resist material according to claim 7, wherein the amount of said photosensitive agent is 10-30 wt% of said resin.

* * * * *